United States Patent
Bock et al.

(10) Patent No.: US 11,600,467 B2
(45) Date of Patent: Mar. 7, 2023

(54) POWER SUPPLY DEVICES FOR PLASMA SYSTEMS AND METHOD OF USE

(71) Applicant: TRUMPF Huettinger GmbH + Co. KG, Freiburg (DE)

(72) Inventors: Christian Bock, Freiburg (DE); Christian Thome, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 17/144,185

(22) Filed: Jan. 8, 2021

(65) Prior Publication Data

US 2021/0134563 A1    May 6, 2021

Related U.S. Application Data

(63) Continuation of application No. PCT/EP2019/068111, filed on Jul. 5, 2019.

(30) Foreign Application Priority Data

Jul. 10, 2018    (DE) .......................... 102018116637.0

(51) Int. Cl.
*H01J 37/32* (2006.01)

(52) U.S. Cl.
CPC .. *H01J 37/32183* (2013.01); *H01J 37/32137* (2013.01)

(58) Field of Classification Search
CPC .......... H01J 37/32183; H01J 37/32137; H01J 37/32; H01J 37/32082; H01J 37/32146; H01J 37/32155; H01J 37/32165; H01J 37/32174

See application file for complete search history.

(56) References Cited

U.S. PATENT DOCUMENTS

| 10,115,567 B2 | 10/2018 | Hirano et al. |
| 2010/0270141 A1 | 10/2010 | Carter et al. |
| 2015/0000841 A1 | 1/2015 | Yamada et al. |

(Continued)

FOREIGN PATENT DOCUMENTS

| DE | 112008003705 | 12/2010 |
| EP | 2174339 | 1/2011 |
| WO | WO 2011/073093 | 6/2011 |

OTHER PUBLICATIONS

DE Office Action in German Appln. No. 102018116637.0, dated Jun. 11, 2019, 18 pages (with English translation).

(Continued)

*Primary Examiner* — Minh D A
(74) *Attorney, Agent, or Firm* — Fish & Richardson P.C.

(57) ABSTRACT

Power supply devices for generating at least one electric high-frequency power signal for a plasma having at least a first plasma state and a second plasma state are provided. The power supply devices are configured to determine a first variable that characterizes a power reflected by the plasma in the first plasma state, determine a second variable that characterizes a power reflected by the plasma in the second plasma state, generate a third variable based on the first variable and the second variable, and control at least one of a frequency or a power of the high-frequency power signal based on the third variable.

23 Claims, 9 Drawing Sheets

(56) References Cited

U.S. PATENT DOCUMENTS

| | | | |
|---|---|---|---|
| 2015/0096684 A1* | 4/2015 | Nagami | H01J 37/32146 156/345.28 |
| 2016/0126063 A1* | 5/2016 | Yamawaku | H01J 37/32651 315/111.21 |
| 2016/0126069 A1* | 5/2016 | Kwon | H01J 37/32183 315/111.21 |
| 2017/0372873 A1 | 12/2017 | Yamada et al. | |
| 2018/0097520 A1 | 4/2018 | Wu | |

OTHER PUBLICATIONS

PCT International Preliminary Report on Patentability in International Appln. No. PCT/EP2019/068111, dated Jan. 12, 2021, 7 pages (with English translation).

PCT International Search Report and Written Opinion in International Appln. No. PCT/EP2019/068111, dated Oct. 4, 2019, 9 pages (with English translation).

* cited by examiner

POWER SUPPLY DEVICES FOR PLASMA SYSTEMS AND METHOD OF USE

CROSS REFERENCE TO RELATED APPLICATIONS

This application is a continuation of and claims priority under 35 U.S.C. § 120 from PCT Application No. PCT/EP2019/068111, filed on Jul. 5, 2019, which claims priority from German Application No. 10 2018 116 637.0, filed on Jul. 10, 2018. The entire contents of each of these priority applications are incorporated herein by reference.

TECHNICAL FIELD

The present disclosure relates to power supply devices for generating at least one electric high-frequency power signal for a plasma that has at least one first plasma state and a second plasma state.

The present disclosure also relates to corresponding methods for operating such a power supply device.

BACKGROUND

It is known to operate conventional plasma systems, such as, to be used, for example, for etching processes in semiconductor manufacture, in particular to supply them with high-frequency energy by at least one power supply device, so that at least two different plasma states are established. For example, some high-frequency (HF) plasma processes are switched back and forth between two or more states, for example by simultaneous application of the at least one high-frequency power signal and by pulsed direct current (DC) or a pulsed additional high-frequency power signal. In these conventional plasma systems, impedance matching does not work optimally, so that a part of the high-frequency power signal is reflected from the plasma process back to the power supply device.

SUMMARY

In one aspect, the present disclosure features power supply devices for generating at least one electric high-frequency power signal for a plasma, which has at least one first plasma state and a second plasma state, wherein the power supply device is configured to ascertain (or determine) a first, e.g., two-dimensional or complex, variable that characterizes a power reflected by the plasma in the first plasma state, to ascertain a second, e.g., two-dimensional or complex, variable that characterizes a power reflected by the plasma in the second plasma state, to form a third variable depending on the first and second variables, and to control (e.g., modulate, modify, regulate, or adjust) the frequency and/or the power of the high-frequency power signal depending on the third variable.

Complex variables are understood herein to mean variables that are defined as an extension of the linear value range with exclusively real variables over the two-dimensional value range with complex variables. This extension is done by introducing the imaginary number j with the property $j^2=1$. Complex variables can be represented, for example, in the form $z=a+b*j$, where a and b are real variables and j is the imaginary unit. "a" is called the real part of the complex variable and "b" the imaginary part of the complex variable. Complex variables can be represented in a plane in a coordinate system in which the imaginary part extends perpendicular to the real part. Complex variables can also be represented in the form, for example, $z=r*e^{j\varphi}$. The following relationship applies between a, b, r and φ: $a=r*\cos \varphi$ and $b=r*\sin \varphi$, where r is the amount of the complex variable, i.e., the length of the resulting vector from real part and imaginary part, and y is the phase angle between the resulting vector made up of the real part and imaginary part with respect to the real part axis. Complex variables can be, for example, impedance, power, or the reflection factor.

The principles according to the embodiments described herein allows the plurality of plasma states to be taken into account, as a result of which the problems known from the prior art with regard to an impedance matching of the power supply device to the plasma can be reduced or avoided.

In some embodiments, controlling the frequency of the high-frequency power signal includes at least temporarily increasing the frequency of the high-frequency power signal and/or at least temporarily reducing the frequency of the high-frequency power signal. Such a frequency change of the high-frequency power signal can be carried out relatively quickly and accordingly allows an efficient control or regulation of the power supply device, for example, in the sense of an impedance matching to the impedance of the plasma.

In some embodiments, controlling the power of the high-frequency power signal includes at least temporarily increasing the electrical power of the high-frequency power signal and/or at least temporarily reducing the electrical power of the high-frequency power signal. This also allows efficient control or regulation of the power supply device.

By ascertaining the first and second variables and forming the third variable depending thereon, operation of the plasma can be characterized and evaluated more precisely. Furthermore, an actual load on the power supply device or its components can thus be ascertained and/or controlled more precisely than in conventional systems. This also considerably increases the safety and reliability of such plasma systems, for example against failure and destruction. It is important to take into account that, on the one hand, the plasma systems themselves are very complex and expensive, and this to an ever increasing extent. It is expected that the complexity of semiconductor production will double every 1 to 2 years, which causes prices in the production facilities to rise even faster. In addition, a failure of the systems is also very expensive, since the constantly increasing complexity means that more and more components are provided on a wafer. In the event of a failure or an incorrect measurement, entire wafers can be destroyed. Increasingly, this is not only undesirable, but has to be ruled out with an ever increasing probability.

Overall, the principles according to the embodiments allow, for example, efficient power regulation even in those plasma systems in which the plasma has at least two different plasma states. The principles according to the embodiments can also be applied to those plasma systems in which the plasma has more than two different plasma states or alternates between these different plasma states.

In further embodiments, a first plasma state can be characterized, for example, in that, the power supply device supplies the plasma with the electric high-frequency power signal. By way of example, the electric high-frequency power signal can have a first frequency, where the first frequency is between approximately 10 megahertz (MHz), and approximately 190 MHz, where the first frequency can have at least approximately one of the following values: 13.56 MHz, 27.12 MHz, 40.68 MHz, 60 MHz, 81 MHz, and 161 MHz. In further embodiments, other values are also possible for the first frequency.

In contrast, a second plasma state of the plasma can be characterized in that the plasma, in addition to being acted upon by the electric high-frequency signal of the first frequency, is provided with a further signal, which can be a high-frequency signal that can have the same or a different frequency than the first frequency or that can be a direct current signal. A temporal change between the first plasma state and the second plasma state is predetermined, for example, by a pulse frequency that determines the times at which the plasma is (additionally) acted upon by the further signal.

As described herein, each plasma in the different plasma states can have a different impedance for the first high-frequency signal. For operation of the power supply devices according to the embodiments, e.g., for power control, for example with the aim of reducing and/or limiting power reflected by the plasma, this can be accomplished by considering the third variable or using the third variable for controlling the frequency and/or by taking into account the power of the high-frequency power signal.

In some further embodiments, it is provided that the first variable characterizes a temporal mean value of an instantaneous value of the power reflected by the plasma, for example, over at least one time period of the high-frequency power signal, and the phase angle between the forward and reflected high-frequency wave during the first plasma state.

In some further embodiments, it is provided that the first variable is a complex impedance or a complex reflection factor of the plasma during the first plasma state.

In some further embodiments, it is provided that the first variable corresponds to the temporal mean value of the instantaneous value of the power reflected by the plasma, for example over at least one time period of the high-frequency power signal, and to the phase angle between forward and reflected high-frequency wave during the first plasma state.

A complex-valued power can be calculated from an absolute power and a phase angle. Likewise, a conversion can occur between the ratio of emitted and reflected high-frequency power, as well as the phase angle between the forward and reflected high-frequency wave on the one hand and the complex impedance or else the complex reflection factor on the other hand.

In some further embodiments, it is provided that the second variable characterizes a temporal mean value of an instantaneous value of the power reflected by the plasma, for example over at least one time period of the high-frequency power signal, as well as the phase angle between the forward and reflected high-frequency wave during the second plasma state.

In some further embodiments, it is provided that the second variable is a complex impedance or a complex reflection factor of the plasma during the second plasma state.

In some further embodiments, it is provided that the second variable corresponds to the temporal mean value of the instantaneous value of the power reflected by the plasma, for example via at least one time period of the high-frequency power signal, as well as to the phase angle between the forward and reflected high-frequency wave during the second plasma state.

In some further embodiments, the power supply device can also be connected to the plasma or to a plasma chamber containing the plasma via an impedance matching device, for example a matching network ("matchbox"), which allows an impedance matching of the electrical load of the plasma ("plasma load") related, for example, to the frequency of the at least one electric high-frequency power signal.

If such an impedance matching device is provided, it can be provided in further embodiments that the aforementioned first variable and/or second variable in each case characterizes a temporal mean value of an instantaneous value of the power reflected by the system including the plasma and the impedance matching device (which represents a complex load impedance for the power supply device), for example, over at least one time period of the high-frequency power signal, as well as by the phase angle between the forward and reflected high-frequency waves during the first or second plasma state. In other words, in some further embodiments in which an impedance matching device is provided between the power supply device and the plasma, the resulting complex impedance of the system including the plasma and the impedance matching device or a variable characterizing this resulting complex impedance can be considered instead of the complex impedance of the plasma. In some further embodiments, this applies correspondingly to a high-frequency line which connects the plasma chamber and/or the impedance matching device and/or the power supply device to one another and which can carry out an impedance transformation, which, however, is not considered below.

In some further embodiments, it is provided that the power supply device is configured to ascertain the third variable as a weighted complex mean value of the first variable and the second variable or a variable derived from the weighted complex mean value, such as the absolute value or the square of the absolute value of the weighted complex mean value. This can allow variables that characterize the different plasma states, namely the first variable and the second variable, to be taken into account efficiently, wherein further degrees of freedom are made possible by the aforementioned weighting.

In some further embodiments, it is provided that the power supply device is configured to a) ascertain a first weighting factor assigned to the first variable depending on at least one time period of the first plasma state, and/or b) to ascertain a second weighting factor assigned to the second variable depending on at least one time period of the second plasma state.

In some further embodiments, it is provided that the power supply device is configured to ascertain a time period of the first plasma state and/or a time period of the second plasma state, for example depending on the first variable and/or the second variable or a variable derived from the first variable and/or the second variable.

In some further embodiments, it is provided that the power supply device is configured to receive at least one variable from an external unit which characterizes a time period of the first plasma state and/or a time period of the second plasma state, for example from a further power supply device, which is also configured to supply the plasma with at least one pulsed high-frequency power signal or a pulsed direct current signal.

In some further embodiments, it is provided that the power supply device is configured to select the first and second weighting factors in such a way that a ratio of the first and second weighting factors to one another corresponds at least approximately (deviations of up to 10 percent are conceivable) to a ratio of the first and second time periods to one another, which can also be referred to as "natural weighting."

In some further embodiments, it is provided that the power supply device is configured to control the third variable depending on at least one of the following elements: a) operating variable, e.g., temperature and/or operating time of at least one component of the power supply device, b) property, e.g., current and/or voltage capacity, of at least one component of the power supply device. The current or voltage load of the individual components of the power supply device due to the reflected power depends heavily on the phase angle between forward and return power.

In some further embodiments, the third variable can be controlled depending on the operating variable and/or the property of at least one component of the power supply device, for example by changing at least one of the aforementioned weighting factors for forming the weighted mean value. In some further embodiments, as an alternative or in addition, the third variable can also be controlled, e.g., changed, directly depending on the operating variable and/or the property of at least one component of the power supply device. As a result, one or more operating variables and/or the properties of at least one component of the power supply device could be included to form the third variable, thereby further allowing a control of the frequency and/or the power of the high-frequency power signal which is individually matched to a specific power supply device, e.g., in the sense of a reduction of a power reflected on the plasma or its effect on the power supply device.

In some further embodiments, it is provided that the power supply device has at least one of the following elements: a controllable oscillator, for example a voltage-controlled oscillator (VCO), a first controllable amplifier, e.g., a driver device, and a second controllable amplifier, e.g., a power amplifier, wherein an operation of the controllable oscillator and/or the first controllable amplifier and/or the second controllable amplifier can be controlled depending on the third variable. In some further embodiments, a high-frequency mixer for power control can also be provided as an alternative or in addition to the first controllable amplifier.

In some further embodiments, it is provided that the power supply device has at least one display device, where the power supply device is configured to output at least one of the following variables via the display device: an or the instantaneous value of the power reflected by the plasma and/or a variable that can be derived from the instantaneous value of the power reflected by the plasma (e.g., the first variable and/or the second variable), the third variable, a reflection factor of the plasma and/or a variable that can be derived from the reflection factor of the plasma.

In some further embodiments, it can be provided that the power supply device is configured to transmit the first variable and/or second variable and/or third variable to an external display device and/or a machine-readable interface, for example for the distinguishable display and/or processing of the first variable and/or the second variable and/or the third variable.

In some further embodiments, it is provided that the power supply device is configured to regulate the frequency and/or the power of the high-frequency power signal depending on the third variable. This allows efficient frequency and/or power regulation of the high-frequency power signal, which can take into account the various plasma states.

In some further embodiments, the power supply device is configured to ascertain a fourth variable which characterizes an absolute power reflected on the plasma. In some further embodiments, the power supply device is configured to regulate the frequency and/or the power of the high-frequency power signal depending on the third variable and the aforementioned fourth variable.

In some further embodiments, it is provided that at least one variable which characterizes an electrical power reflected on the plasma is used to regulate the power of the power supply device. This ensures that the power supply device is protected from impermissible operating conditions (undesired heat loss and/or over voltages). As described herein, a load on the power supply device can be distributed over different components of the power supply device in different plasma states following one another in time succession with corresponding, e.g., different, impedances, which is why higher reflected powers may be permissible for power control, for example, than in plasma systems having only one stationary plasma state. This can be taken into account in the form of the third variable by the principle according to the embodiments. In some embodiments, therefore, the third variable can be used for power regulation (and/or frequency regulation).

Another aspect of the present disclosure features methods for operating a power supply device for generating at least one electric high-frequency power signal for a plasma which has at least one first plasma state and a second plasma state, where the power supply device ascertains a first variable which characterizes a power reflected by the plasma in the first plasma state, ascertains a second variable which characterizes a power reflected by the plasma in the second plasma state, forms a third variable depending on the first and second variable, and controls the frequency and/or the power of the high-frequency power signal depending on the third variable.

In some further embodiments, it is provided that the first variable characterizes a temporal mean value of an instantaneous value of the power reflected by the plasma over at least one time period of the high-frequency power signal and the phase angle between the forward and reflected high-frequency wave during the first plasma state.

In some further embodiments, it is provided that the second variable characterizes a temporal mean value of an instantaneous value of the power reflected by the plasma over at least one time period of the high-frequency power signal as well as by the phase angle between the forward and reflected high-frequency wave during the second plasma state.

In some further embodiments, it is provided that the power supply device ascertains the third variable as a weighted mean value or a variable of the first variable and the second variable derived from the weighted mean value.

In some further embodiments, it is provided that the power supply device a) ascertains a first weighting factor assigned to the first variable depending on at least one time period of the first plasma state, and/or b) ascertains a second weighting factor assigned to the second variable depending on at least one time period of the second plasma state, where the power supply device selects the first and second weighting factor in such a way that a ratio of the first and second weighting factors to one another corresponds at least approximately to a ratio of the first and second time periods to one another.

In some further embodiments, it is provided that the power supply device controls the third variable depending on at least one of the following elements: a) operating variable, e.g., temperature and/or operating time of at least one component of the power supply device, b) property, e.g., current and/or voltage capacity, of at least one component of the power supply device.

In some further embodiments, it is provided that the power supply device has at least one of the following elements: a controllable oscillator, a first controllable amplifier, a second controllable amplifier, e.g., a power amplifier, where the power supply device controls the operation of the controllable oscillator and/or the first controllable amplifier and/or the second controllable amplifier depending on the third variable.

In some further embodiments, it is provided that the power supply device has at least one display device, where the power supply device outputs at least one of the following variables via the display device: an instantaneous value of the power reflected by the plasma and/or a variable that can be derived from the instantaneous value of the power reflected by the plasma, the third variable, a reflection factor of the plasma and/or a variable that can be derived from the reflection factor of the plasma.

In some further embodiments, it is provided that the power supply device regulates the frequency and/or the power of the high-frequency power signal depending on the third variable.

In some further embodiments, it is provided that the power supply device regulates the frequency and/or the power of the high-frequency power signal depending on the third variable and a fourth variable, the fourth variable characterizing an absolute power reflected on the plasma.

It can be provided that a value for regulating the frequency and/or power of the high-frequency power signal is ascertained as a linear combination of the third variable and the fourth variable. For example, in some further embodiments, a value Prr for regulating the power of the high-frequency power signal can be ascertained according to the following equation as a linear combination of the third variable G3 and the fourth variable G4: Prr=k1*G3+k2*G4, where k1 is a coefficient assigned to the third variable G3 and where k2 is a coefficient assigned to the fourth variable G4, and where "*" is the multiplication operator.

In some further embodiments, the power supply device can have a control unit which is configured, for example, to control operation of the power supply device, for example, to ascertain the first variable and/or second variable and/or third variable.

A further aspect of the present disclosure features a use of a power supply device according to the embodiments and/or a method according to the embodiments for regulating an impedance matching device, e.g., a matching network, where the impedance matching device is controlled at least depending on the third variable.

Further features, possible uses and advantages of the present disclosure can be found in the following description of embodiments of the present disclosure, which are shown in the figures of the drawings. All of the features described or illustrated form the subject matter of the present disclosure individually or in any combination, regardless of their summarization in the claims or their reference and regardless of their formulation or representation in the description or in the drawing.

DETAILED DESCRIPTION

Figure 1:
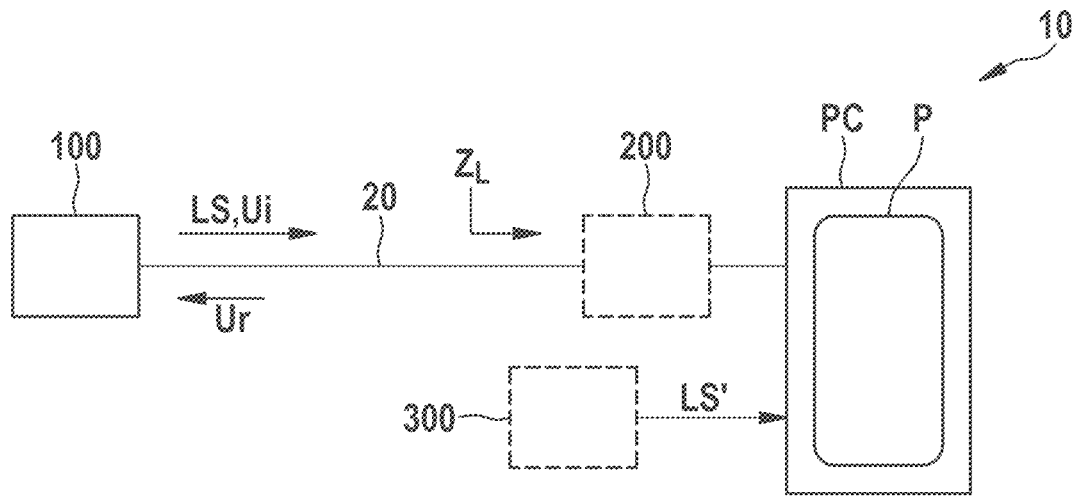
FIG. 1 schematically shows a simplified block diagram of a power supply device according to an embodiment of the present disclosure in a target system.

FIG. 1 schematically shows a simplified block diagram of a power supply device 100 according to an embodiment in a target system 10, which in the present case is a target plasma system 10 with a plasma chamber PC and a plasma P that can be generated therein. The plasma P can be used, for example, for material processing such as, for example, for coating or etching semiconductor components, etc., and can assume different plasma states.

To supply the plasma P, the power supply device 100 generates a high-frequency power signal LS, which has a first frequency that is, for example, between approximately 10 MHz (megahertz) and approximately 190 MHz, where the first frequency can have at least approximately one of the following values: 13.56 MHz, 27.12 MHz, 40.68 MHz, 60 MHz, 81 MHz, and 161 MHz. In further embodiments, other values are also possible for the first frequency.

The high-frequency power signal LS can be fed to the plasma chamber PC and thus to the plasma P via a corresponding high-frequency line 20. Optionally, an impedance matching device 200, for example, a matching network, can be arranged between the power supply device 100 and the plasma chamber PC, which effects an impedance matching of the impedance of the plasma P, preferably in such a way that an electrical power reflected by the plasma P in the direction of the power supply device 100, e.g., at the first frequency, decreases or is reduced. If present, the optional matching network 200, together with the plasma P, forms an electrical load for the power supply device 100, which represents an impedance $Z_L$ that can be a time-variable and complex-valued impedance.

A voltage wave Ui, which runs from the power supply device 100 to the plasma P and corresponds to the high-frequency power signal LS, is also shown in FIG. 1, as is a voltage wave Ur, which returns from the plasma P to the power supply device 100 and corresponds to the electrical power reflected from the plasma P to the power supply device 100.

Optionally, at least one further power supply device 300 can be provided for at least temporarily charging the plasma P with additional electrical power. The further power supply device 300 generates, for example, a pulsed direct voltage or a pulsed direct current, see the further signal LS' with which the plasma P can be supplied in addition to the high-frequency power signal LS. A time course of the signals LS, LS' is given by way of example in FIG. 4A.

Figure 4A:
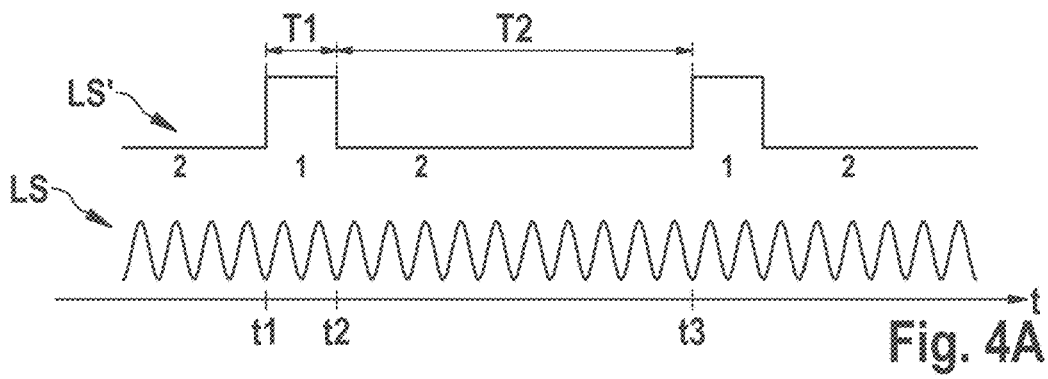
FIGS. 4A to 4E each schematically show a time course of operating variables of one or more embodiments of the present disclosure.

It can be seen from FIG. 4A that, from the first point in time t1 to the second point in time t2, a direct current signal LS' is applied to the plasma P in addition to the high-frequency power signal LS, whereby a first pulse duration T1 is defined. From the second point in time t2 to the third point in time t3, the plasma P is only supplied with the high-frequency power signal LS, and from the third point in time t3 the pulsed direct current signal LS' is additionally applied to the plasma P, and so on. A pulse pause T2 thus corresponds to the time difference between the third point in time t3 and the second point in time t2.

In the operation according to FIG. 4A, the plasma P (FIG. 1) therefore alternately assumes a first plasma state, identified by the number "1" in FIG. 4A, and a second plasma state, identified by the number "2," where the named sequence is repeated periodically here as an example.

Figure 6:
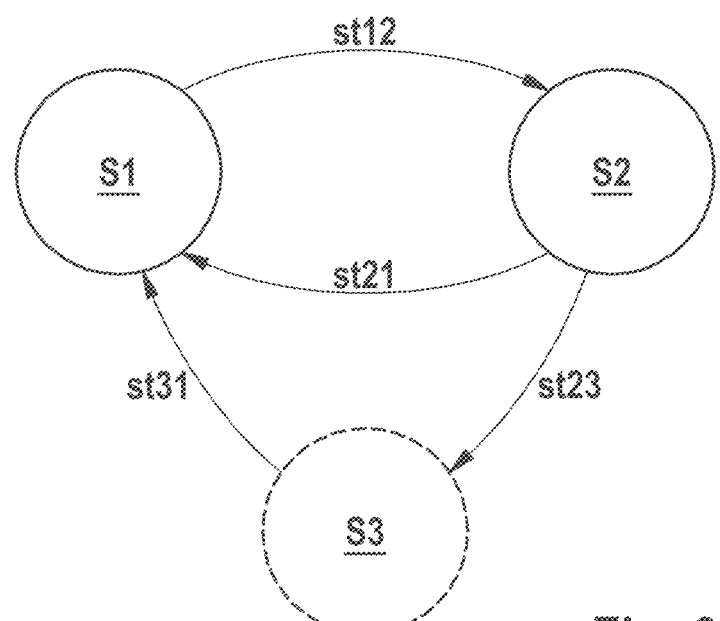
FIG. 6 is a state diagram according to one or more embodiments of the present disclosure.

FIG. 6 shows an example of a state diagram in which the first plasma state is denoted by the reference symbol S1 and the second plasma state is denoted by the reference symbol S2. A first state transition st12 from the first plasma state S1 to the second plasma state S2 occurs, for example, at the second time t2 according to FIG. 4A, and a second state transition st21 from the second plasma state S2 to the first plasma state S1 occurs, for example, at the third time t3 according to FIG. 4A. Further plasma states S3 are also possible in further embodiments.

In some further embodiments, it is provided that the power supply device 100 (FIG. 1) is configured to ascertain a first variable that characterizes a power reflected by the plasma P in the first plasma state S1 (FIG. 6), to ascertain a second variable that characterizes a power reflected by the plasma P in the second plasma state S2, to form a third variable depending on the first and second variables, and to control a frequency and/or a power of the high-frequency power signal LS (FIG. 1) depending on the third variable.

The principles according to the embodiments can allow the plurality of plasma states S1, S2 to be taken into account, whereby the problems known from the prior art with regard to an impedance matching of the power supply device 100 to the plasma can be reduced or avoided.

Figure 2:
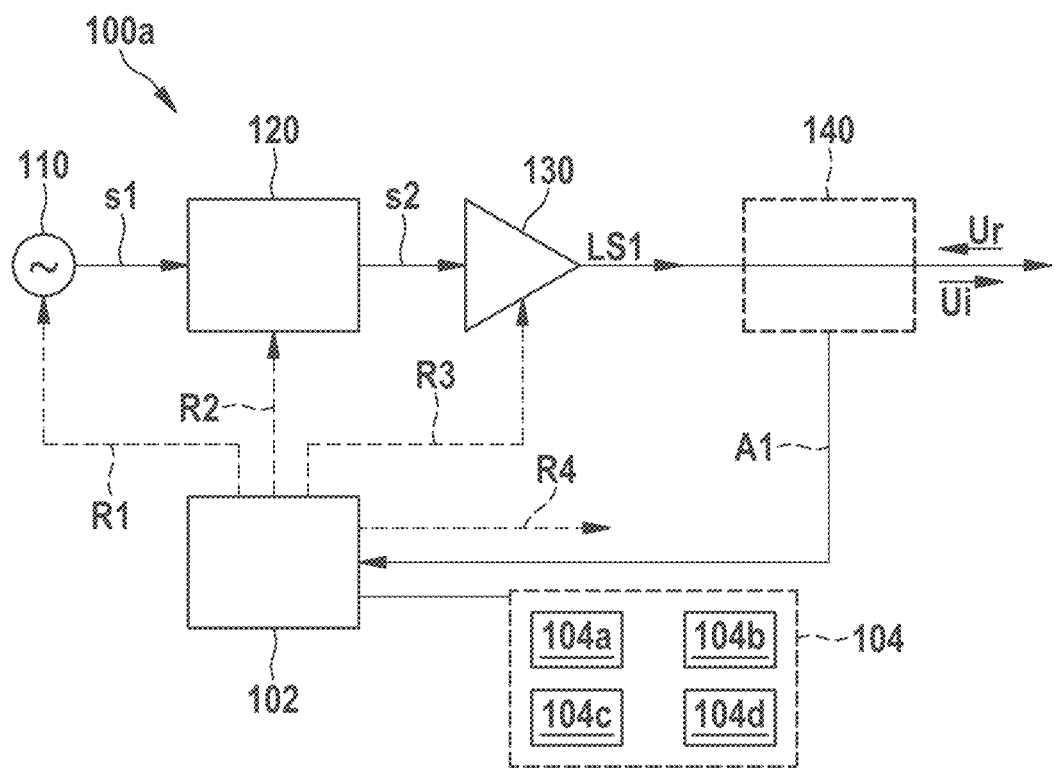
FIG. 2 schematically shows a simplified block diagram of a power supply device according to a further embodiment of the present disclosure.

FIG. 2 schematically shows a simplified block diagram of a further embodiment 100a. For example, the power supply device 100 according to FIG. 1 can have the configuration shown in FIG. 2—or at least parts thereof. The power supply device 100a shown in FIG. 2 can have a controllable oscillator, for example a voltage controlled oscillator (VCO) 110, a first, e.g., controllable, amplifier 120 (such as a driver device), and a second, e.g., controllable, amplifier 130 (such as a power amplifier). The controllable oscillator 110 generates a first signal s1, e.g., a high-frequency signal, a specifiable first frequency, for example with a frequency of approximately 13.56 MHz. Via the control signal R1, a control unit (or controller) 102 of the power supply device 100a can control the first frequency, so that frequency tuning (e.g., setting of the frequency) is possible, e.g., also during operation of the power supply device 100a.

The driver device 120 amplifies the first signal s1 and outputs a correspondingly amplified second signal s2, which is further amplified by the power amplifier 130, as a result of which the high-frequency power signal LS1 is finally obtained which in some embodiments essentially corresponds to the high-frequency power signal LS according to FIG. 1. For example, the high frequency power signal LS1 can have an electrical power up to several kilowatts, kW, at the first frequency. If the driver device 120 is configured to be controllable, a signal amplification that can be brought about by the drive device 120 can be controlled by the control unit 102, for example via the control signal R2. The same applies to a further adjustable signal amplification by the power amplifier 130 (see the control signal R3).

If an impedance matching device 200 (see FIG. 1) is provided, the impedance matching device 200 can also be controlled by the control unit 102 in further embodiments (see the control signal R4).

Figure 3A:
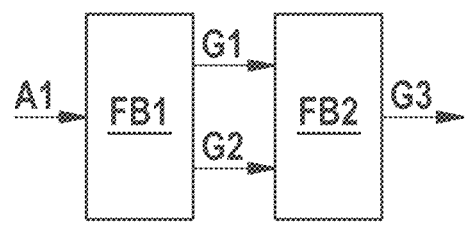
FIGS. 3A, 3B and 3C each schematically show a simplified block diagram of further aspects of one or more embodiments of the present disclosure.

Also shown in FIG. 2 is a directional coupler 140, which in the present case provides signals A1 that characterize the incoming voltage wave Ui and the returning voltage wave Ur. Instead of the directional coupler 140, in further embodiments a voltage/current decoupling ("VI sample," not shown) can also be provided, and the signals A1 can be derived from voltage and current signals provided thereby. From the signals A1, the control unit 102 can ascertain the aforementioned first variable G1 and/or the second variable G2 and/or the third variable G3, or all three variables G1, G2, G3 (see also the block diagram according to FIG. 3A in this regard). As shown in FIG. 3A, a first function block FB1 of the control unit 102 ascertains the first variable G1 and the second variable G2 depending on the signals A1. A second function block FB2 of the control unit 102 ascertains the third variable G3 depending on the first and second variables G1, G2. The control unit 102 (FIG. 2) can then control a frequency and/or a power of the high-frequency power signal LS1 depending on the third variable G3, for example in the sense of a regulation, e.g., a reduction and/or limitation, of the electrical power reflected by the plasma P.

In some embodiments, controlling the frequency of the high-frequency power signal LS, LS1 includes at least temporarily increasing the frequency of the high-frequency power signal and/or at least temporarily reducing the frequency of the high-frequency power signal. Such a frequency change of the high-frequency power signal can be carried out comparatively quickly and accordingly allows an efficient control or regulation of the power supply device 100a, for example, in the sense of an impedance matching to the impedance of the plasma P.

In some further embodiments, controlling the power of the high-frequency power signal LS1 includes at least temporarily increasing the electrical power of the high-frequency power signal LS1 and/or at least temporarily reducing the electrical power of the high-frequency power signal LS1. This also allows efficient control or regulation of the power supply device 100a.

By ascertaining the first and second variables G1, G2 and forming the third variable G3 in dependence thereon, an operation of the plasma P (FIG. 1) can be characterized and evaluated more precisely. Furthermore, an actual load on the power supply device 100, 100a or the components 110, 120, 130 thereof can thereby be ascertained more precisely than in conventional systems. This also considerably increases the safety and reliability of such plasma systems, for example, against failure and destruction.

Overall, the principles according to the embodiments allow, for example, an efficient power regulation even in those plasma systems in which the plasma P has at least two different plasma states S1, S2 (FIG. 6). The principle according to the embodiments can also be applied to plasma systems in which the plasma P has more than two different plasma states S1, S2, S3 (FIG. 6) or alternates between these different plasma states.

As disclosed herein, the plasma P in the different plasma states usually has a different, complex-valued impedance. For operation of the power supply device 100, 100a according to the embodiments, e.g., for power regulation, for example with the aim of reducing and/or limiting a power reflected by the plasma P, this can be efficiently taken into account by considering the third variable G3 or using the third variable G3 for controlling the frequency and/or the power of the high-frequency power signal LS, LS1.

Figure 5A:
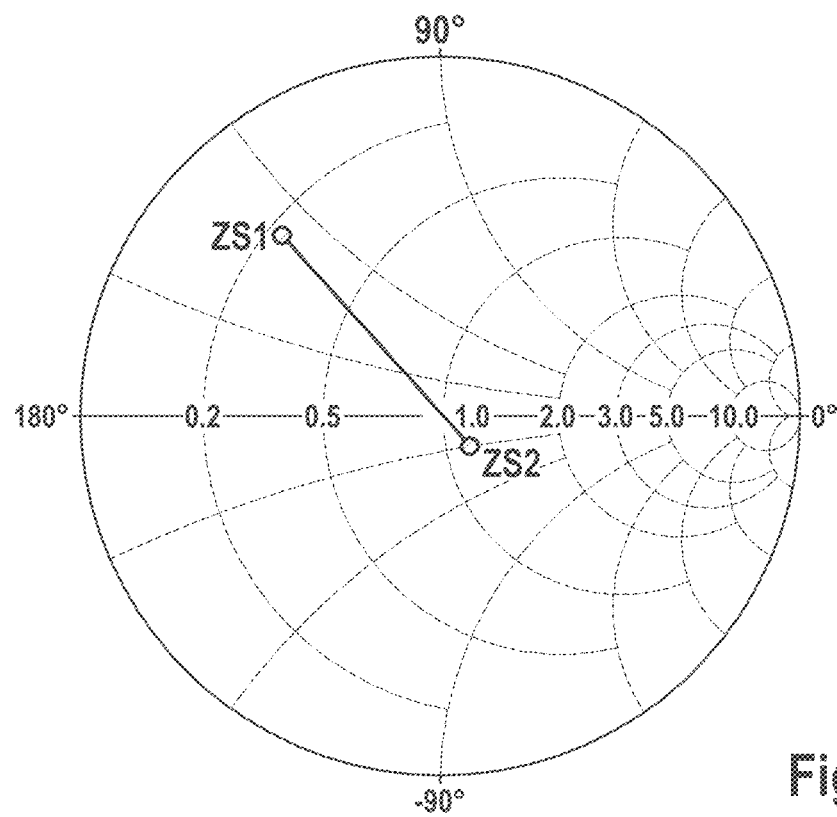
FIGS. 5A to 5E each schematically show impedances of a plasma, as result, for example, according to the time course of the operating variables according to FIGS. 4A to 4E.

FIG. 5A shows an example of a Smith diagram of an impedance plane in which a first impedance ZS1 is drawn in, which plane corresponds to the impedance of the plasma P (FIG. 1) in the first plasma state S1 (see also the reference number 1 according to FIG. 4A). A second impedance ZS2 is also plotted in FIG. 5A and corresponds to the impedance of the plasma P in the second plasma state S2 (see also the reference symbol 2 according to FIG. 4A). With the change between successive first and second plasma states S1, S2 (see FIG. 6), the impedance of the plasma P accordingly alternates between the values ZS1, ZS2 given by way of example in FIG. 5A.

Therefore, with conventional plasma systems and conventional power supply devices, it is difficult to achieve an optimal impedance matching to the impedance of the plasma P, because the change between the different plasma states S1, S2 can sometimes take place very quickly (e.g., in less than 1 s) and conventional impedance matching devices do not have the dynamics required for optimal impedance matching.

Accordingly, it is advantageous, according to the principle of the embodiments, to take into account the third variable G3, which reflects controls of both the power reflected in the first plasma state S1 or the corresponding impedance ZS1 and the power reflected in the second plasma state S2 or the corresponding impedance ZS2. For example, in some embodiments, power regulation of the power supply device 100, 100a can be provided in response to a setpoint value that is ascertained depending on the third variable G3.

In some further embodiments, it is provided that the first variable G1 characterizes a temporal mean value of an instantaneous value of the power reflected by the plasma P, e.g., over at least one time period of the high-frequency power signal LS, during the first plasma state S1.

In some further embodiments, it is provided that the first variable G1 is an impedance or a reflection factor of the plasma P during the first plasma state S1.

In some further embodiments, it is provided that the first variable G1 corresponds to the temporal mean value of the instantaneous value of the power reflected by the plasma P, e.g., over at least one time period of the high-frequency power signal LS, during the first plasma state S1.

In some further embodiments, it is provided that the second variable G2 characterizes a temporal mean value of an instantaneous value of the power reflected by the plasma P, e.g., over at least one time period of the high-frequency power signal LS, during the second plasma state S2.

In some further embodiments, it is provided that the second variable G2 is an impedance or a reflection factor of the plasma P during the second plasma state S2.

In some further embodiments, it is provided that the second variable G2 corresponds to the temporal mean value of the instantaneous value of the power reflected by the plasma P, e.g., over at least one time period of the high-frequency power signal LS during the second plasma state S2.

In some further embodiments, it is provided that the power supply device 100a (FIG. 2) or its control unit 102 is configured to ascertain the third variable G3 as a weighted mean value of the first variable G1 and the second variable G2. This calculation can be carried out, for example, by the second function block FB2 according to FIG. 3A. This can allow variables characterizing the different plasma states S1, S2, namely the first variable G1 and the second variable G2, to be taken into account efficiently, where further degrees of freedom are made possible by the aforementioned weighting. The third variable G3 corresponds essentially to a complex impedance averaged over the various plasma states S1, S2.

Figure 3B:
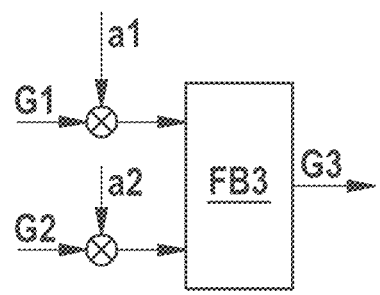

FIG. 3B schematically shows a simplified block diagram, from which it can be seen that the first variable G1 is multiplied by a first weighting factor a1 and the second variable G2 is multiplied by a second weighting factor a2, where the third function block FB3 ascertains the third variable G3 as a weighted mean value depending on the products obtained thereby.

In some further embodiments, it is provided that the power supply device 100, 100a is configured to a) ascertain a first weighting factor a1 (FIG. 3B) assigned to the first variable G1 depending on at least one time period T1 (FIG. 4A) of the first plasma state S1 (FIG. 6), and/or b) to ascertain a second weighting factor a2 assigned to the second variable G2 (FIG. 3B) depending on at least one time period T2 of the second plasma state S2.

In some further embodiments, it is provided that the power supply device 100, 100a is configured to ascertain a time period T1 of the first plasma state S1 and/or a time period T2 of the second plasma state S2, for example depending on the first variable G1 and/or the second variable G2 or a respective variable derived from the first variable G1 and/or the second variable G2.

In some further embodiments, it is provided that the power supply device 100, 100a is configured to receive at least one variable characterizing a time period of the first plasma state S1 and/or a time period of the second plasma state S2 from an external unit 300 (FIG. 1), for example from a further power supply device, which is also configured to supply the plasma P with at least one (further) power signal LS'.

In some further embodiments, it is provided that the power supply device 100, 100a is configured to select the first and second weighting factors a1, a2 in such a way that a ratio of the first and second weighting factors to one another corresponds at least approximately (deviations of up to 10 percent are conceivable) to a ratio of the first and second time periods to one another, which can also be referred to as "natural weighting."

In some further embodiments, it is provided that the power supply device 100, 100a is configured to control the third variable G3 (FIG. 3A) depending on at least one of the following elements: a) operating variable, e.g., temperature and/or operating time of at least one component 110, 120, 130 (FIG. 2) of power supply device 100a, and b) property (or characteristic), e.g., current and/or voltage capacity of at least one component 110, 120, 130 of the power supply device 100a depending on the complex reflected power.

In some further embodiments, the third variable G3 can be controlled depending on the operating variable and/or the property of at least one component of the power supply device 100a, for example by changing at least one of the aforementioned weighting factors a1, a2 for the formation of the weighted mean value. In some further embodiments, the third variable G3 can alternatively or additionally also be controlled, e.g., changed, directly depending on the operating variable and/or the property of at least one component 110, 120, 130 of the power supply device 100a. As a result, one or more operating variables and/or the properties of at least one component of the power supply device could be included to form the third variable G3, thereby making it possible to control the frequency and/or the power of the high-frequency power signal individually in a manner individually matched to a specific power supply device 100a, e.g., in the sense of a power regulation, such as further in the sense of a reduction and/or limitation of a power reflected on the plasma P.

In some further embodiments, it is provided that the power supply device 100a has at least one display device 104, where the power supply device 100a is configured to output at least one of the following variables via the display device 104: an instantaneous value of the power reflected by the plasma and/or a variable that can be derived from the instantaneous value of the power reflected by the plasma, the third variable, a reflection factor of the plasma, and/or a variable that can be derived from the reflection factor of the plasma. For example, in the configuration according to FIG. 2, four values can be displayed by the four display units 104a, 104b, 104c, 104d. As an alternative or in addition to a display of numeric or alphanumeric values, a graphic display is also conceivable, for example the display of a Smith diagram with values drawn therein, for example values for an impedance or a reflection factor and the like, similar to FIG. 5A.

Further possible plasma states that the plasma P (FIG. 1) can assume in different embodiments are described below with reference to FIGS. 4B to 5E.

Figure 4B:
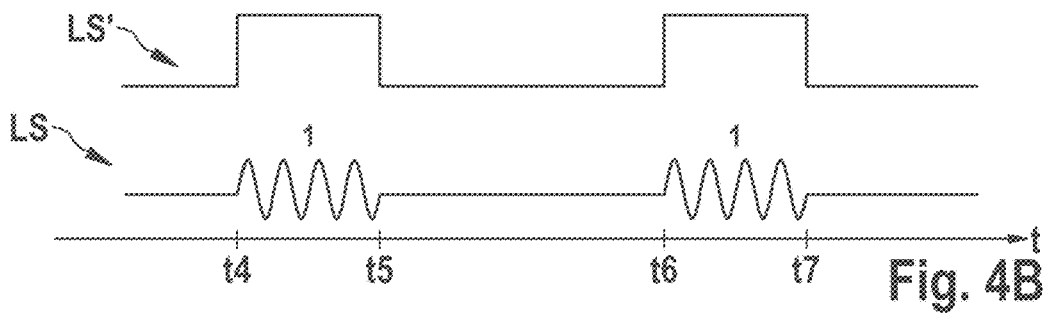
Figure 5B:
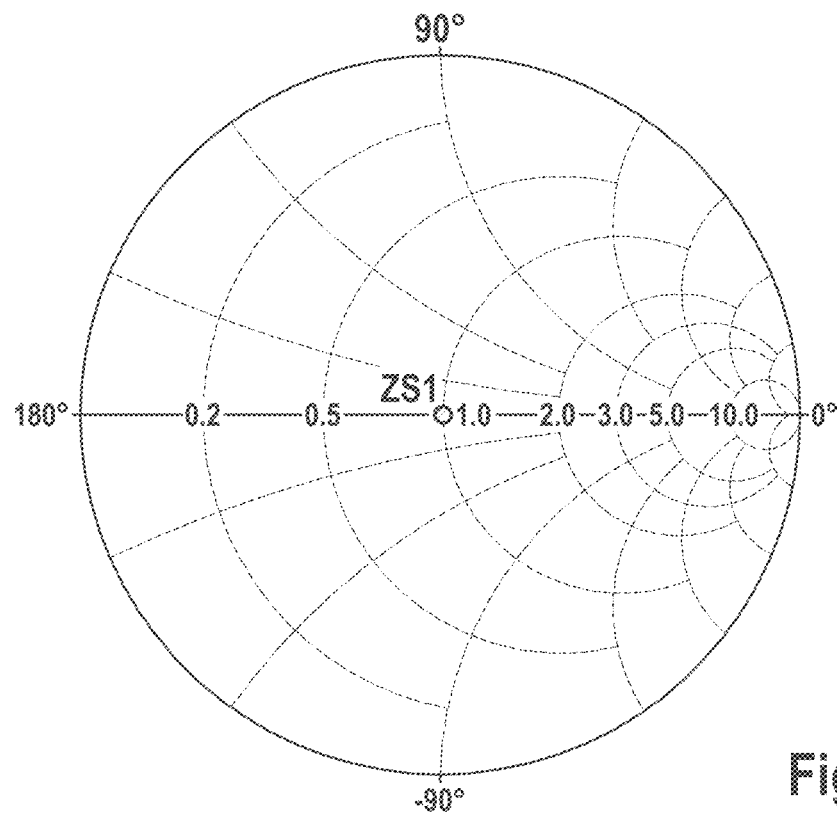

According to FIG. 4B, the plasma is periodically acted upon simultaneously with the two signals LS, LS' in the time intervals (t4, t5), (t6, t7) etc., thereby resulting in a single plasma state and a corresponding impedance value ZS1 (FIG. 5B).

Figure 4C:
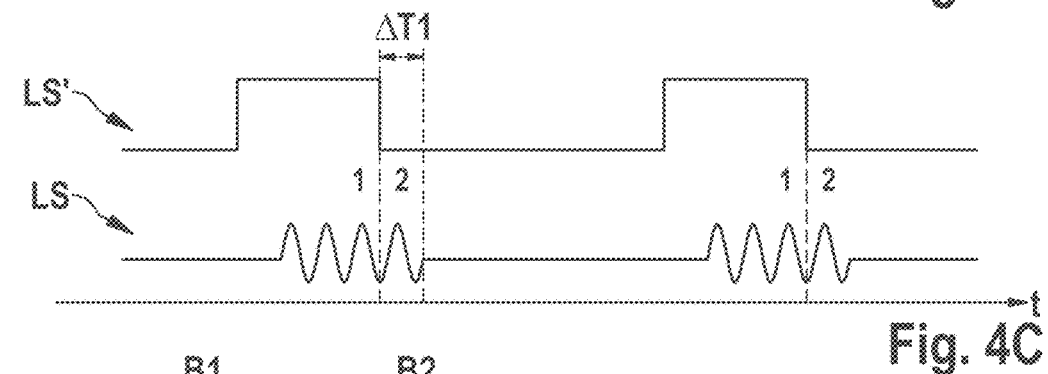
Figure 5C:
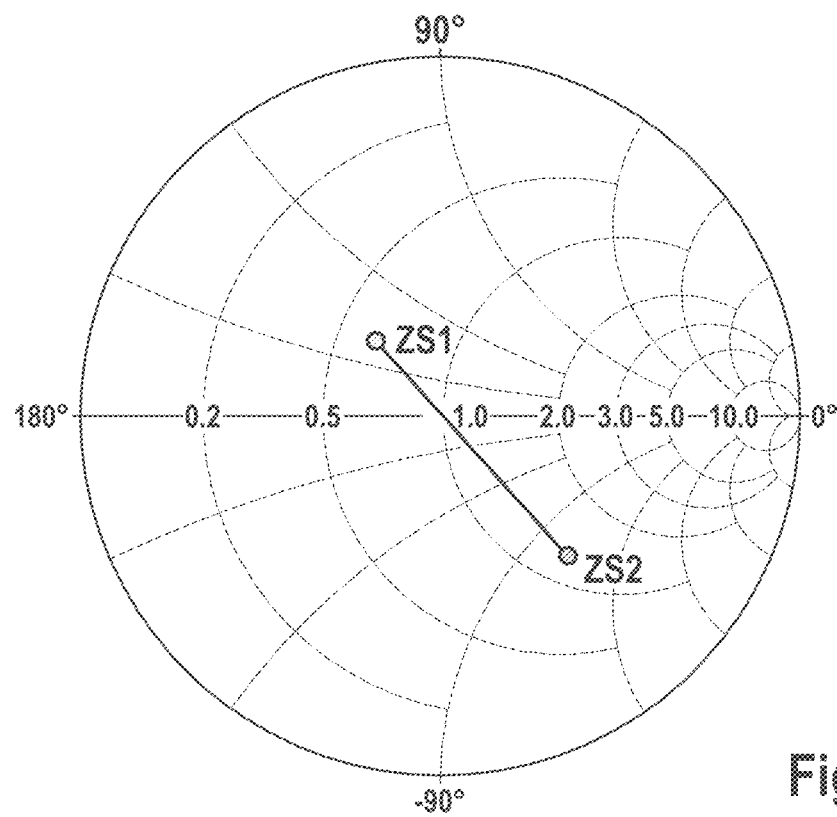
Figure 5D:
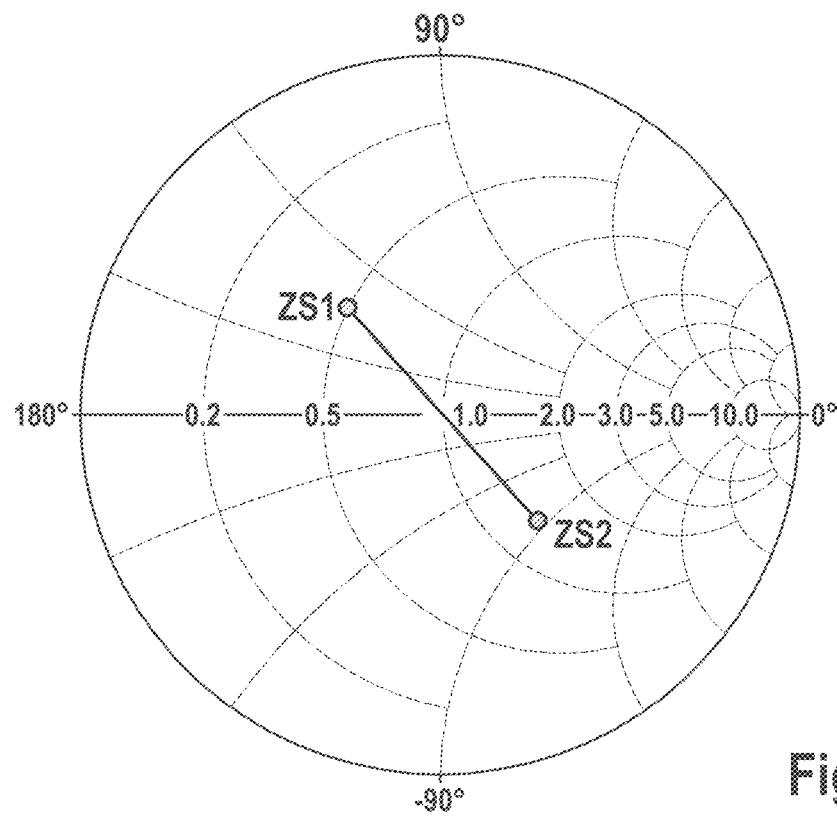

In contrast, according to FIG. 4C, the—in this case pulsed—high-frequency power signal LS is shifted by a non-vanishing first time offset $\Delta T1$ compared to the pulsed direct current signal LS1', which in turn results in two different plasma states, identified in FIG. 4C by the numbers "1," "2," which correspond to the two impedance values ZS1, ZS2 shown in FIG. 5C.

Figure 4D:
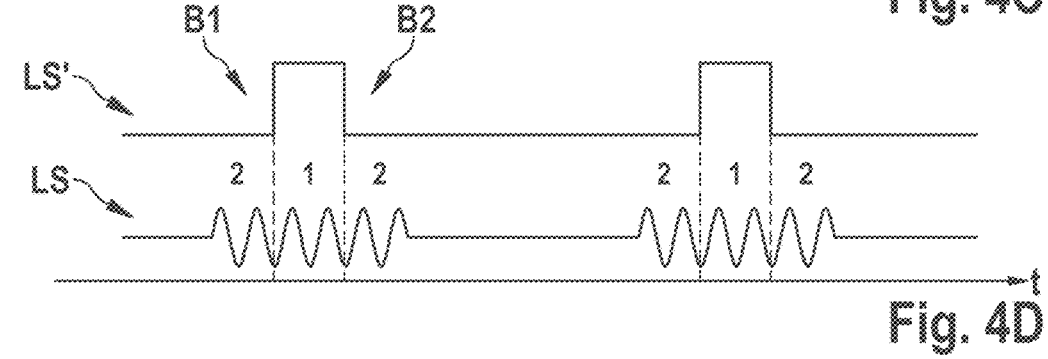

In the situation shown in FIG. 4D, the pulsed high-frequency power signal LS passes over the direct current pulses LS', as can be seen from the drawing, in the two time ranges B1, B2, so that, again, two different plasma states 1, 2 are produced that have impedances ZS1, ZS2 (see FIG. 5D) that accordingly correspond.

Figure 4E:
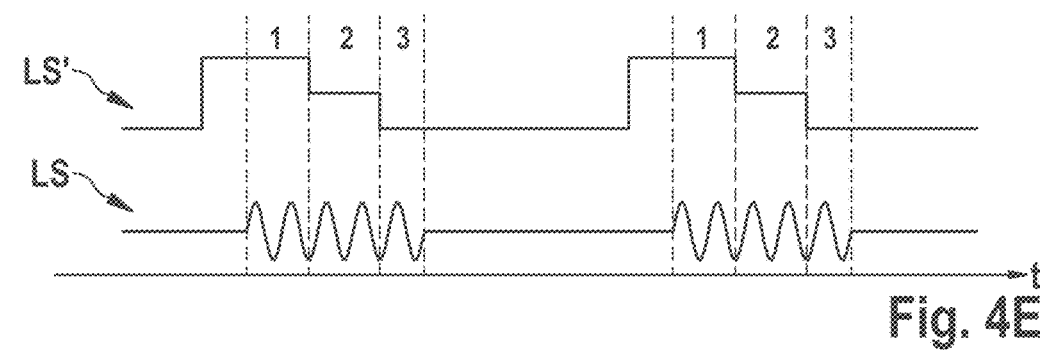
Figure 5E:
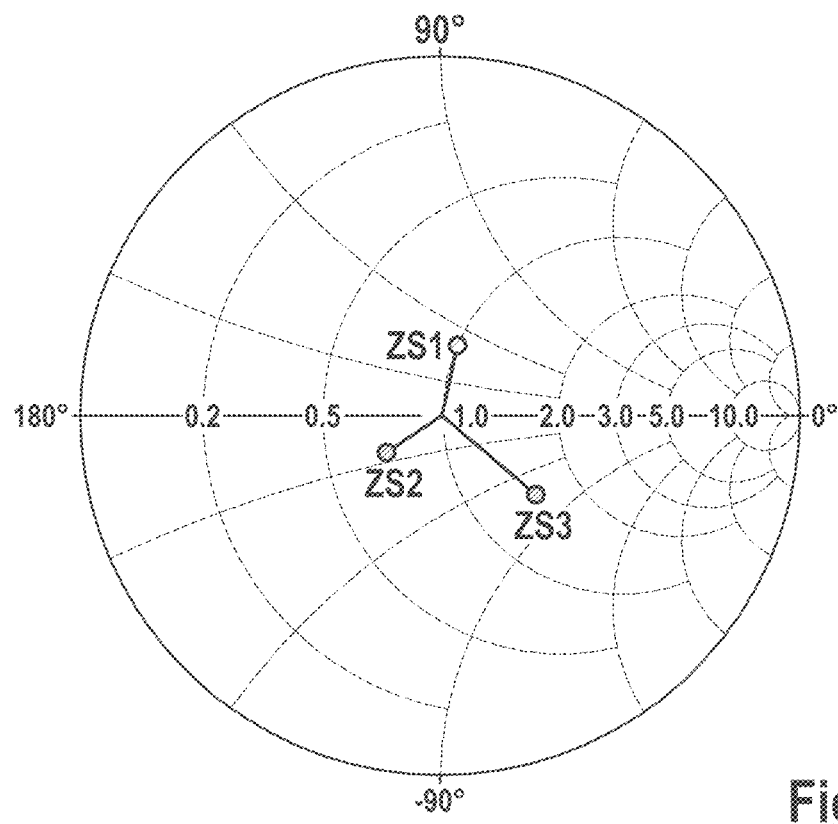

The time courses of the signals LS, LS' shown schematically in FIG. 4E result in a total of three different plasma states 1, 2, 3 with three corresponding impedance values ZS1, ZS2, ZS3 (see the illustration according to FIG. 5E). The third plasma state is denoted by the reference symbol S3 in the state diagram according to FIG. 6, just as corresponding state transitions from the second plasma state S2 or to the first plasma state S1 are denoted st23, st31.

The principles according to the embodiments can be used in all the scenarios shown above by way of example with reference to FIGS. 4A-4E and can allow the ascertainment of the third variable G3, which characterizes an electrical power reflected by the plasma during the various plasma states.

Figure 7:
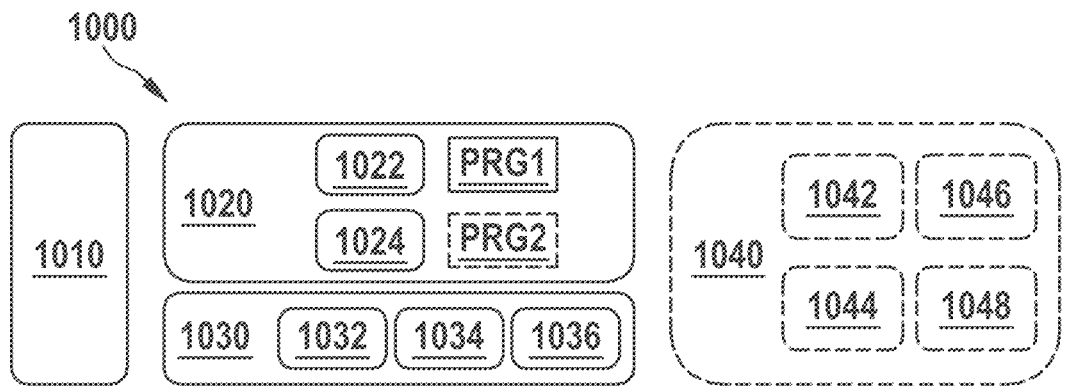
FIG. 7 schematically shows a configuration of a control device according to one or more embodiments of the present disclosure.

In some further embodiments, the control unit 102 (FIG. 2) has, for example, at least essentially a configuration 1000 shown in FIG. 7.

The configuration 1000 has a computing device 1010 such as a microcontroller and/or microprocessor and/or digital signal processor (DSP) and/or a programmable logic module (e.g., a field-programmable gate array (FPGA)), and/or an application-specific integrated circuit (ASIC) and a memory device 1020 for at least temporary storage of one or more computer programs (PRGs) PRG1, PRG2, etc. At least one of the computer programs PRG1, PRG2 can be provided to control an operation of the power supply device 100, 100a, e.g., to carry out the methods according to the embodiments. For example, at least one of the variables G1, G2, G3 can be ascertained under the control of one of the computer programs PRG1, PRG2. The memory device 1020 can have a volatile memory 1022 such as a main memory (e.g., random access memory (RAM)) and/or a non-volatile memory 1024 (e.g., read-only memory (ROM) and/or electrically erasable programmable read-only memory (EEPROM), e.g., Flash EEPROM or the like).

Furthermore, the configuration 1000 can have a peripheral device 1030, which can have at least one signal processing device 1032 (analog filter device is also possible) and/or ADC (analog/digital converter) 1034 and/or data interface 1036 that is implemented at least partially in hardware.

In some further embodiments, it can be provided that the power supply device or the control unit 102 is configured to transmit the first variable G1 and/or the second variable G2 and/or the third variable G3 to an external display device (not shown) and/or a machine-readable interface (not shown), e.g., for the distinguishable display and/or processing of the first variable and/or the second variable and/or the third variable, and can be done, for example, via the data interface 1036.

The reference number 1040 in FIG. 7 denotes an optional display device for outputting one or more values. The display device 1040 can have one or more display units 1042, 1044, 1046, 1048, which are each configured to output or display numeric values or alphanumeric values or to display graphics.

Figure 8:
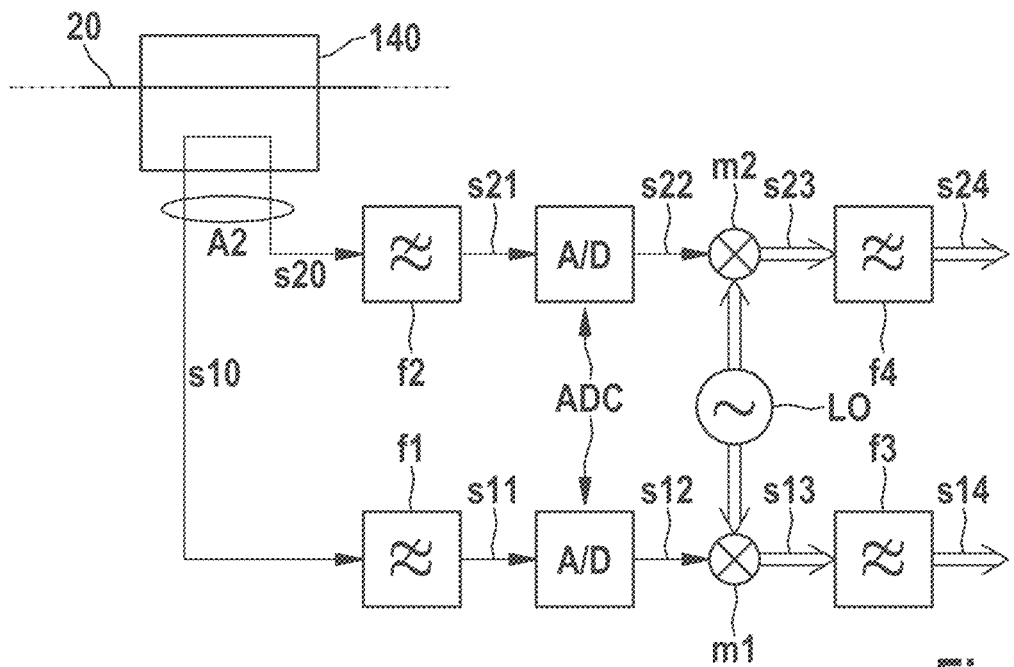
FIGS. 8 and 9 each schematically show a simplified block diagram according to one or more embodiments of the present disclosure.

FIG. 8 schematically shows a simplified block diagram of a further embodiment of exemplary aspects of the power supply device 100, 100a. The configuration shown can be used to ascertain complex-valued baseband signals s14, s24, which characterize the leading voltage wave Ui and the returning voltage wave Ur on the high-frequency line 20 (FIG. 1), thus including information about the electrical power reflected by the plasma P. In some further embodiments, the first variable G1, the second variable G2, and the third variable G3 can be ascertained from this.

Shown are the directional coupler 140 and a part of the high-frequency line 20 via which the high-frequency power signal LS, LS1 can be transmitted from the power supply device 100, 100a to the plasma chamber PC. By the directional coupler 140, the signals A1 (see also FIG. 2) are made available which characterize the incoming voltage wave Ui and the returning voltage wave Ur. The signal s10 characterizes the returning voltage wave Ur, and the signal s20 characterizes the incoming voltage wave Ui. The signals s10, s20 are each subjected to a bandpass filtering or, as shown by way of example, a lowpass filtering by the filter units f1, f2, whereby the filtered signals s11, s21 are obtained. After an analog/digital conversion by the analog/ digital converter (ADC), there are time-discrete digital signals s12, s22, which are subjected to a frequency transformation into the baseband position ("down conversion") using a local oscillator (LO) signal by the multipliers m1, m2, whereby the complex signals s13, s23 are obtained. Optionally, a further low-pass filtering by the filter units f3, f4 (e.g., half-band filter) can be provided, whereby the complex signals s14, s24 are obtained.

In some further embodiments, one or more of the signal processing steps described above according to FIG. 8 can be carried out, for example, by the control unit 102, for example by its signal processing device 1032. In some further embodiments, discrete-time digital signals s12, s22, s13, s23, s14, s24 can also be processed, for example, by the computing unit 1010 by appropriate computer programs PRG1, PRG2. The same applies to the function blocks FB1, FB2, FB3 according to FIGS. 3A, 3B.

Figure 9:
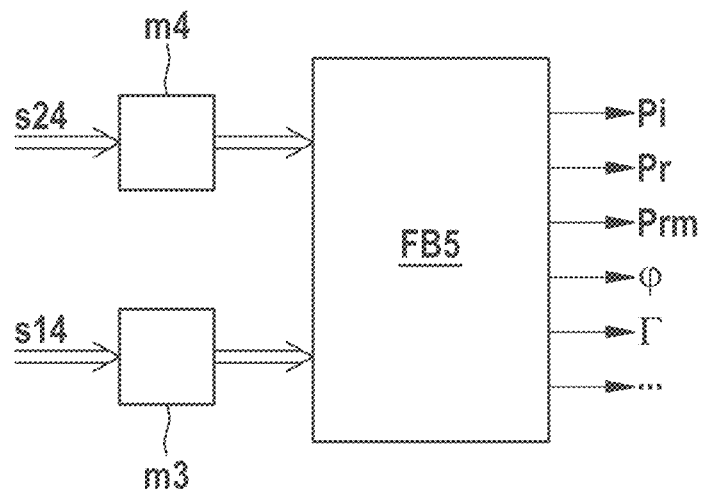

One or more of the following variables can be ascertained from the complex-valued baseband signals s14, s24, for example by the function block FB5 according to FIG. 9: a power ("forward power") Pi output by the power supply device 100 to the plasma P and coming in at the plasma P, a power Pr reflected by the plasma P, a mean reflected power Prm, a phase angle φ between the incoming and the returning voltage wave, a complex-valued reflection factor F, and optionally further variables that can be derived from the signals s14, s24 such as, for example, first variable G1 and/or second variable G2 and/or third variable G3. In some embodiments, the function block FB5 can be implemented in the control unit 102.

The further blocks m3, m4 are optional and, in some embodiments, can be used for preprocessing the signals s14, s24 before the block FB5. In some further embodiments, the blocks m3, m4 can also be omitted.

In some further embodiments, the function block FB5 can, for example, also have squaring devices in the form of a hardware circuit, one or more CORDIC (coordinate rotation digital computer) calculation units for the efficient calculation of trigonometric functions, e.g., for ascertaining the phase angle φ, and the like.

Figure 10A:
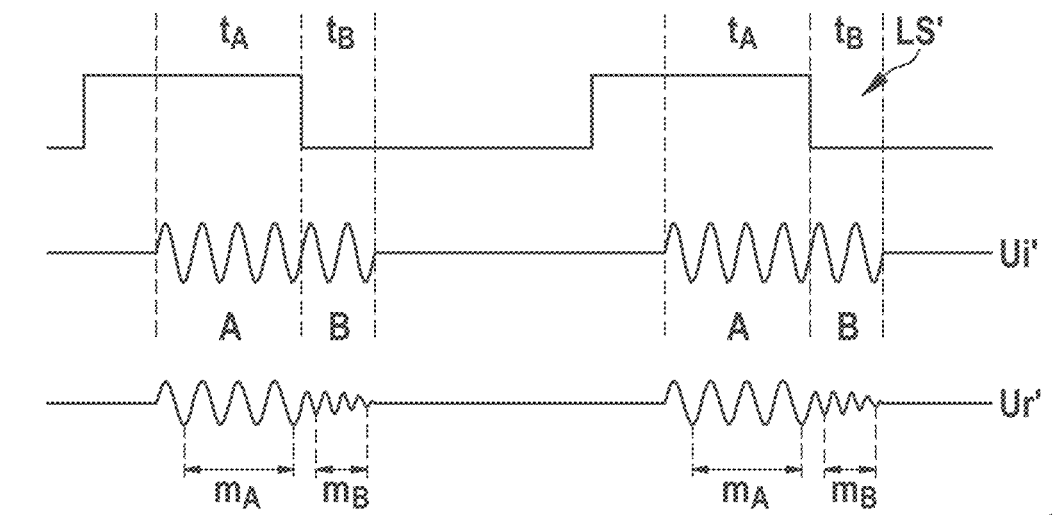
FIG. 10A schematically shows a time course of operating variables according to one or more embodiments of the present disclosure.

FIG. 10A schematically shows a time course of operating variables according to some further embodiments. A pulsed DC voltage LS' and a time course of a signal Ui' characterizing the incoming voltage wave Ui and of a signal Ur' characterizing the returning voltage wave Ur are shown. A first measurement phase $m_A$ corresponding to a first time interval to and a second measurement phase $m_B$ corresponding to a second time interval $t_B$ are also shown.

Figure 10B:
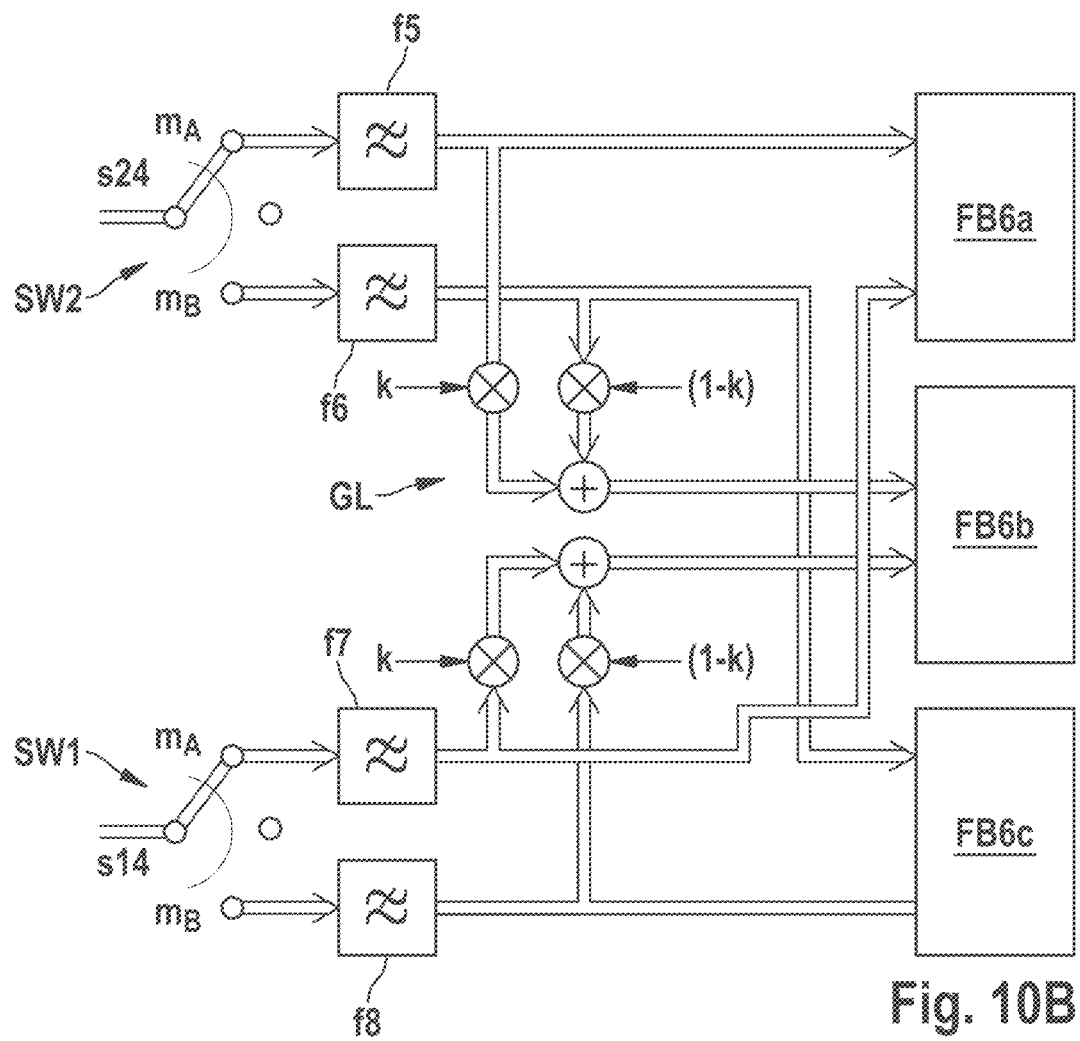
FIG. 10B schematically shows a simplified block diagram of the operating variables according to FIG. 10A.

FIG. 10B schematically shows a simplified block diagram of a configuration for processing signals that occur in the operating situation according to FIG. 10A. In some embodiments, the configuration can be implemented in the power supply device 100, 100a. The complex-valued baseband signals s14, s24, such as can be obtained, for example, by the configuration shown in FIG. 8, are shown on the left in FIG. 10B. Also shown are three function blocks FB6a, FB6b, FB6c, each of which can, for example, have at least essentially the configuration described above with reference to FIG. 9. Via the switches SW1, SW2, the complex-valued signals s14, s24—controlled depending on a respective existing measurement phase $m_A$ or $m_B$—can optionally be fed to different filter units f5, f6, f7, f8, which can filter the signals fed to them over one or more pulse durations. As can be seen from FIG. 10B, the signals filtered through the filter units f5 to f8 are then fed, either directly or via a weighting logic GL, to the three function blocks FB6a, FB6b, FB6c, which ascertain therefrom one or more of the variables Pi, Pr, Prm, φ, Γ described above in reference to FIG. 9. The function block FB6a ascertains one or more of the named variables Pi, Pr, Prm, φ, Γ for the first measurement phase $m_A$, the function block FB6c one or more of the named variables Pi, Pr, Prm, φ, Γ for the second measurement phase $m_B$, and the function block FB6b one or more of the named quantities Pi, Pr, Prm, φ, Γ as quantities weighted over the two measurement phases $m_A$, $m_B$. The weighting logic GL uses a first weighting factor k for the first measurement phase and a second weighting factor (1-k) for the second measurement phase.

For example, with the configuration described above with reference to FIG. 10B, the first variable G1 can be ascertained, for example using the function block FB6a, and/or the second variable G2, for example using the function block FB6c, and/or the third variable G3, for example using the function block FB6b. The coefficients k, (1-k) correspond, for example, to the weighting factors a1, a2 according to FIG. 3B.

Figure 11A:
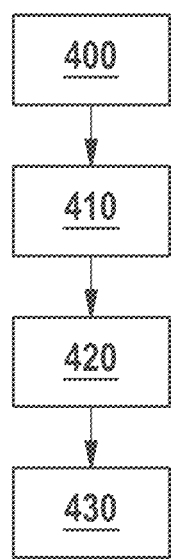
FIG. 11A schematically shows a simplified flow diagram of a method according to one embodiment of the present disclosure.

FIG. 11A schematically shows a simplified flow diagram of a method according to an embodiment. In a first step 400, the power supply device 100, 100a or its control unit 102 ascertains the first variable G1 (FIG. 3A); in step 410 the power supply device 100, 100a or its control unit 102 ascertains the second variable G2 (FIG. 3A); in step 420, the power supply device 100, 100a or its control unit 102 ascertains the third variable G3 depending on the first variable G1 and the second variable G2. In step 430 the power supply device 100, 100a or its control unit 102 then controls a frequency and/or a power of the high-frequency power signal LS, LS1. In some embodiments, at least one of the control signals R1, R2, R3, R4, but at least one of the control signals R1, R2, R3, can be used for this purpose, because these control signals allow the frequency and/or power of the high-frequency power signal LS, LS1 to be controlled relatively quickly.

Figure 11B:
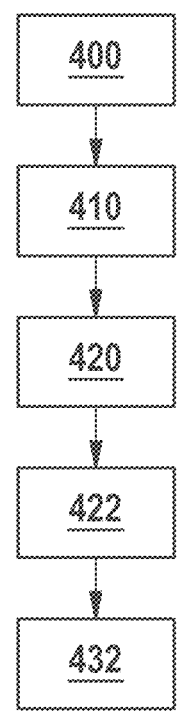
FIG. 11B schematically shows a simplified flow diagram of a method according to a further embodiment of the present disclosure.

FIG. 11B schematically shows a simplified flow diagram of a method according to a further embodiment. The steps 400, 410, 420 corresponding to the method according to FIG. 11A. In step 422, the power supply device 100, 100a or its control unit 102 ascertains a fourth variable G4, which characterizes an absolute power reflected on the plasma P. In step 432, the power supply device 100, 100a or its control unit 102 regulates the frequency and/or the power of the high-frequency power signal LS, LS1 depending on the third variable G3 and the fourth variable G4.

Figure 3C:
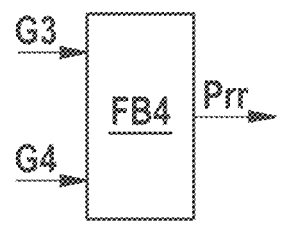

FIG. 3C schematically shows a simplified block diagram from which it can be seen that a functional unit FB4 receives the third variable G3 and the fourth variable G4 as input variables and, depending on this, ascertains a value Prr for power control for the high-frequency line signal LS, LS1.

It can be provided that the value Prr for the power regulation is ascertained as a linear combination of the third variable G3 and the fourth variable G4. For example, in some further embodiments, the value Prr for regulating the power of the high-frequency power signal LS, LS1 can be ascertained according to the following equation as a linear combination of the third variable G3 and the fourth variable G4: Prr=k1*G3+k2*G4, where k1 is a coefficient assigned to the third variable G3 and where k2 is a coefficient assigned to the fourth variable G4, and where "*" is the multiplication operator. For example, the coefficient k1 can be selected to be approximately 0.6, and the coefficient k2 can be selected to be approximately 0.4. For example, the control unit 102 can set the control signals R1 and/or R2 and/or R3 and/or R4 depending on the variable Prr.

In some further embodiments, it is provided that at least one variable which characterizes an electrical power reflected on the plasma is used to regulate the power of the power supply device. This ensures that the power supply device is protected from impermissible operating conditions (undesired heat loss and/or over voltages). As described herein, a load on the power supply device can be distributed over different components of the power supply device 100, 100a in different plasma states S1, S2 following one another in time succession with corresponding, e.g., different, impedances, which is why higher reflected powers may be permissible for power control, for example, than in plasma systems having only one (stationary) plasma state. This can be taken into account by the principle according to the embodiments in the form of the third variable G3. Therefore, in some embodiments the third variable G3 can be used for power regulation (and/or frequency regulation), where appropriate in combination with the fourth variable already described above.

Further embodiments relate to a use of a power supply device 100, 100a according to the embodiments and/or of a method according to the embodiments for regulating an impedance matching device 200 (FIG. 1), for example of a matching network, where the regulation of the impedance matching device 200 is carried out at least depending on the third variable G3. In other words, in addition to controlling the frequency and/or power of the high-frequency power signal LS, LS1, the method according to the embodiments can also be used, for example by the control signals R1, R2, R3, to control or regulate any impedance matching device 200 that may be present by the control signal R4, for example.

OTHER EMBODIMENTS

A number of embodiments of the present disclosure have been described. Nevertheless, it will be understood that various modifications may be made without departing from the spirit and scope of the present disclosure. Accordingly, other embodiments are within the scope of the following claims.

What is claimed is:

1. A power supply device comprising:
   at least one power supply component configured to generate at least one electric high-frequency power signal for a plasma having at least a first plasma state and a second plasma state; and
   a controller configured to provide at least one control signal to the at least one power supply component,
   wherein the controller is configured to:
     determine a first variable that characterizes a first power reflected by the plasma in the first plasma state,
     determine a second variable that characterizes a second power reflected by the plasma in the second plasma state,
     generate a third variable based on the first variable and the second variable, and
     control at least one of a frequency or a power of the high-frequency power signal based on the third variable.

2. The power supply device of claim 1, wherein the first variable characterizes a temporal mean value of an instantaneous value of the first power reflected by the plasma over at least one time period of the high-frequency power signal and a phase angle between forward and reflected high-frequency waves during the first plasma state.

3. The power supply device of claim 1, wherein the second variable characterizes a temporal mean value of an instantaneous value of the second power reflected by the plasma over at least one time period of the high-frequency power signal and a phase angle between forward and reflected high-frequency waves during the second plasma state.

4. The power supply device of claim 1, wherein the controller is configured to generate the third variable as a weighted mean value of the first variable and the second variable.

5. The power supply device of claim 4, wherein the controller is configured to:
   determine a first weighting factor assigned to the first variable based on at least one first time period of the first plasma state, and
   determine a second weighting factor assigned to the second variable based on at least one second time period of the second plasma state.

6. The power supply device of claim 5, wherein the controller is configured to:
   select the first weighting factor and the second weighting factor such that a ratio of the first weighting factor and the second weighting factor corresponds at least approximately to a ratio of the first time period and the second time period.

7. The power supply device of claim 1, wherein the controller is configured to control the third variable based on at least one of:
   an operating variable of the at least one power supply component, the operating variable comprising at least one of a temperature or an operating time of the at least one power supply component, or
   a characteristic of the at least one power supply component, the characteristic comprising at least one of a current capacity or a voltage capacity of the at least one power supply component.

8. The power supply device of claim 1,
   wherein the at least one power supply component comprises at least one of a controllable oscillator, a first controllable amplifier, or a second controllable amplifier, and
   wherein the controller is configured to control an operation of the at least one of the controllable oscillator, the first controllable amplifier, or the second controllable amplifier based on the third variable.

9. The power supply device of claim 1, further comprising at least one display device, and wherein the power supply device is configured to output at least one variable via the display device, the at least one variable comprising at least one of:
   an instantaneous value of the first power reflected by the plasma in the first plasma state or an instantaneous value of the second power reflected by the plasma in the second plasma state,
   a variable derived from the instantaneous value of the first power reflected by the plasma or the instantaneous value of the second power reflected by the plasma,
   the third variable,
   a reflection factor of the plasma, or
   a variable derived from the reflection factor of the plasma.

10. The power supply device of claim 1, wherein the controller is configured to regulate the at least one of the frequency or the power of the high-frequency power signal based on the third variable and a fourth variable, and wherein the fourth variable characterizes an absolute power reflected by the plasma.

11. The power supply device of claim 1, wherein the first variable characterizes a temporal mean value of an instantaneous value of the first power reflected by the plasma over at least one time period of the high-frequency power signal and a phase angle between forward and reflected high-frequency waves during the first plasma state,
   wherein the second variable characterizes a temporal mean value of an instantaneous value of the second power reflected by the plasma over at least one time period of the high-frequency power signal and a phase angle between forward and reflected high-frequency waves during the second plasma state,
   wherein the at least one power supply component comprises at least one of a controllable oscillator, a first controllable amplifier, or a second controllable amplifier, and
   wherein the controller is configured to control an operation of the at least one of the controllable oscillator, the first controllable amplifier, or the second controllable amplifier based on the third variable.

12. The power supply device of claim 1, further comprising:
   at least one further power supply component configured to generate at least one pulsed direct current or voltage signal for the plasma in additional to the high-frequency power signal, the first plasma state and the second plasma state being determined at least partially based on the pulsed direct current or voltage signal.

13. The power supply device of claim 1, wherein the first variable comprises at least one of a first impedance of the plasma during the first plasma state or a first reflection factor of the plasma during the first plasma state, and
   wherein the second variable comprises at least one of a second impedance of the plasma during the second plasma state or a second reflection factor of the plasma during the second plasma state.

14. A method of operating a power supply device for generating at least one electric high-frequency power signal for a plasma having at least a first plasma state and a second plasma state, the method comprising:
   determining a first variable that characterizes a first power reflected by the plasma in the first plasma state;
   determining a second variable that characterizes a second power reflected by the plasma in the second plasma state;
   generating a third variable based on the first variable and the second variable; and
   controlling at least one of a frequency or a power of the high-frequency power signal based on the third variable.

15. The method of claim 14, wherein the first variable characterizes a temporal mean value of an instantaneous value of the first power reflected by the plasma over at least one time period of the high-frequency power signal during the first plasma state.

16. The method of claim 14, wherein the second variable characterizes a temporal mean value of an instantaneous value of the second power reflected by the plasma over at least one time period of the high-frequency power signal during the second plasma state.

17. The method of claim 14, wherein generating the third variable based on the first variable and the second variable comprises determining the third variable as a weighted mean value of the first variable and the second variable.

18. The method of claim 17, wherein determining the third variable as the weighted mean value of the first variable and the second variable comprises:
   determining a first weighting factor assigned to the first variable based on at least one first time period of the first plasma state, and/or
   determining a second weighting factor assigned to the second variable depending on at least one second time period of the second plasma state,
   wherein the first weighting factor and the second weighting factor are determined such that a ratio of the first weighting factor and the second weighting factor corresponds at least approximately to a ratio of the first time period and the second time period.

19. The method of claim 14, further comprising controlling the third variable based on at least one of:
   an operating variable of at least one power supply component of the power supply device, the operating variable comprising at least one of a temperature or an operating time of at least one power supply component of the power supply device, or
   a characteristic of the at least one power supply of the power supply device, the characteristic comprising at least one of a current capacity or a voltage capacity of the at least one power supply component of the power supply device.

20. The method of claim 14,
   wherein the power supply device comprises at least one of a controllable oscillator, a first controllable amplifier, or a second controllable amplifier, and
   wherein the method further comprises:
      controlling an operation of the at least one of the controllable oscillator, the first controllable amplifier, or the second controllable amplifier based on the third variable.

21. The method of claim 14, wherein the power supply device comprises at least one display device, and wherein the method further comprises outputting via the display device at least one of:
   an instantaneous value of the first power reflected by the plasma in the first plasma state or an instantaneous value of the second power reflected by the plasma in the second plasma state,
   a variable derived from the instantaneous value of the first power reflected by the plasma or the instantaneous value of the second power reflected by the plasma,
   the third variable,
   a reflection factor of the plasma, or
   a variable derived from the reflection factor of the plasma.

22. The method of claim 14, wherein controlling the at least one of the frequency or the power of the high-frequency power signal based on the third variable comprises regulating the at least one of the frequency or the power of the high-frequency power signal based on the third variable and a fourth variable, wherein the fourth variable characterizes an absolute power reflected on the plasma.

23. A method for regulating an impedance matching device coupled between a power supply device and a plasma chamber, the method comprising:
   operating the power supply device to generate at least one electric high-frequency power signal for a plasma generated in the plasma chamber, the plasma having at least a first plasma state and a second plasma state, the operating comprising:
      determining a first variable that characterizes a first power reflected by the plasma in the first plasma state,
      determining a second variable that characterizes a second power reflected by the plasma in the second plasma state, generating a third variable based on the first variable and the second variable, and controlling at least one of a frequency or a power of the high-frequency power signal based on the third variable; and regulating the impedance matching device at least based on the third variable.

\* \* \* \* \*